(12) United States Patent
Oh et al.

(10) Patent No.: US 6,366,118 B2
(45) Date of Patent: Apr. 2, 2002

(54) ANTIFUSE REPAIR CIRCUIT

(75) Inventors: Jin Keun Oh, Ichon; Jae Kyung Wee, Seoul; Chang Hyuk Lee; Phil Jung Kim, both of Ichon, all of (KR)

(73) Assignee: Hyundai Electronics Industries Co., Ltd., Hyungki-do (KR)

( * ) Notice: Subject to any disclaimer, the term of this patent is extended or adjusted under 35 U.S.C. 154(b) by 0 days.

(21) Appl. No.: 09/790,019

(22) Filed: Feb. 21, 2001

(30) Foreign Application Priority Data

Feb. 21, 2000 (KR) ........................................ 2000-08122

(51) Int. Cl.[7] .............................................. G06F 7/38
(52) U.S. Cl. ............................. 326/38; 326/10; 326/47
(58) Field of Search ............................... 326/9, 10, 16, 326/38, 47

(56) References Cited

U.S. PATENT DOCUMENTS 6,301,164 B1 * 10/2001 Manning et al. ............. 365/200
6,317,370 B2 * 11/2001 Shirley ........................ 365/200

* cited by examiner

Primary Examiner—Michael Tokar
Assistant Examiner—Anh Q. Tran
(74) Attorney, Agent, or Firm—Marshall, Gerstein, Borun.

(57) ABSTRACT

An antifuse repair circuit is disclosed for selectively programming a specific antifuse to replace a defective cell with a redundant cell. The antifuse repair circuit includes: (a) a special test mode decoder for selecting an antifuse box according to an address signal; (b) a bank selector for selecting an antifuse bank according to the output signal from the special test mode decoder and the address signal; (c) a special address multiplexer for selecting a specific antifuse within an antifuse bank selected by the bank selector according to the output signal from the bank selector and the address signal; (d) a negative voltage generator for generating a negative voltage to program an antifuse device; (e) a power-up detector for detecting the supply voltage to generate a plurality of control signals in order to detect whether the antifuse device is programmed; (f) a unit antifuse circuit for programming the antifuse device according to the signals from the special test mode detector, the special address multiplexer, the negative voltage generator and the power-up detector; and (g) a repair circuit responsive to the output signal from the unit antifuse circuit and an external control signal to replace a defective cell with a redundant cell.

11 Claims, 9 Drawing Sheets

ANTIFUSE REPAIR CIRCUIT

FIELD OF THE INVENTION

The invention relates generally to a repair circuit using an antifuse, and more particularly to, an antifuse repair circuit having a special address multiplexer for repairing defective cells.

BACKGROUND OF THE INVENTION

A conventional repair technology employs a laser repair method by which a poly fuse is blown by lasers in the state of a wafer. The packaged memory devices experience a final test, which is performed after a burn-in stress is applied. The test shows that about 5% to about 15% are defective. As the products are packaged, however, it is impossible to use a laser repair method. In order to reduce these defective products, a repair technology using an antifuse has been developed. In order to implement this antifuse, every antifuse in the antifuse box requires a specific address. As the antifuse is programmed one by one, many addresses must be decoded in order to implement a specific address.

However, as one antifuse box includes 22 (twenty-two) fuses, the number of fuses becomes very great. As a result, there is a problem in manufacturing a memory chip since a large number of address pins must be added.

DETAILED DESCRIPTION OF PREFERRED EMBODIMENTS

Figure 1:
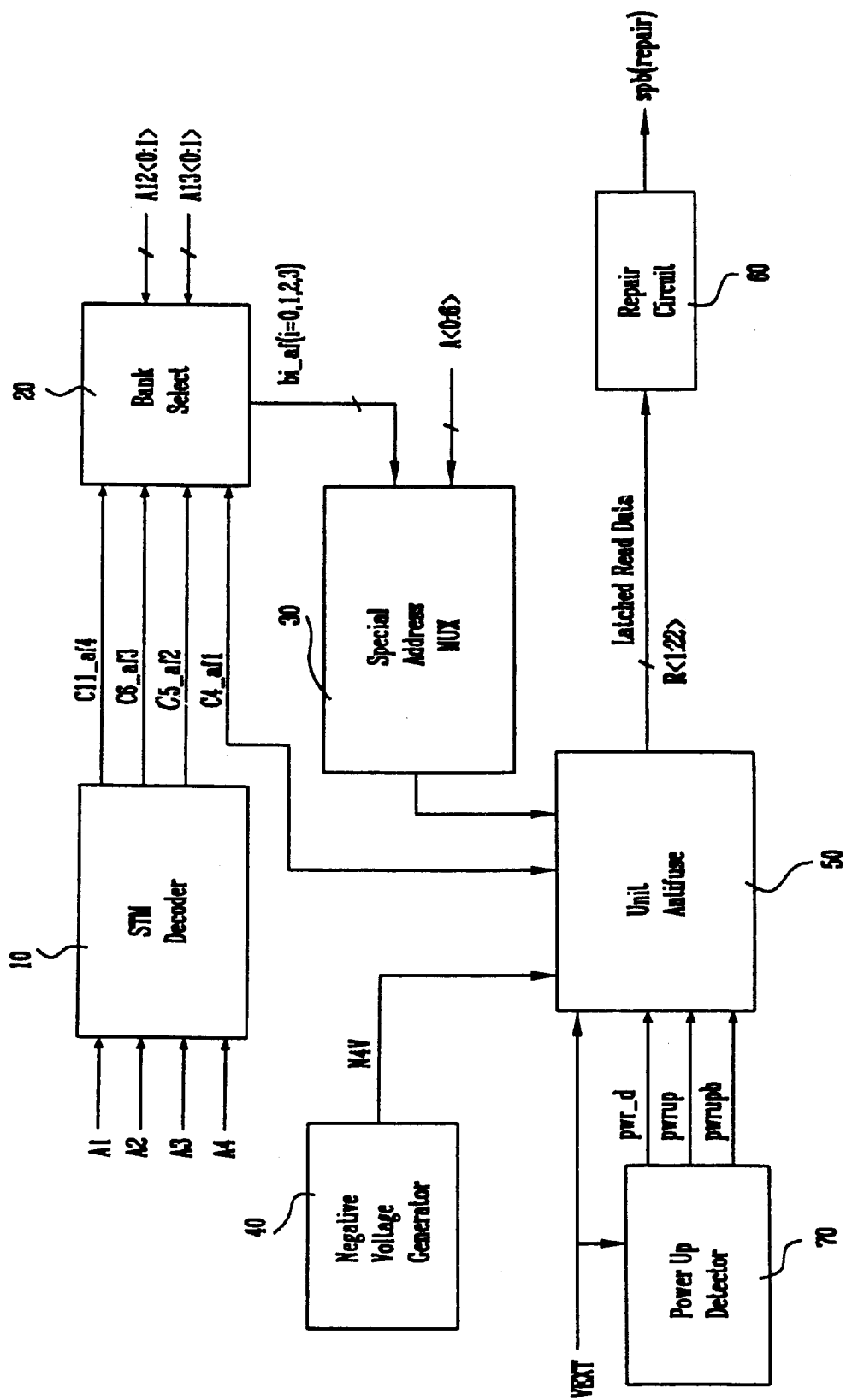
FIG. 1 is a block diagram of an antifuse repair circuit constructed in accordance with the teachings of the present invention.

A preferred antifuse circuit constructed in accordance with the teachings of the invention will be described in detail with reference to the accompanying drawings, in which like reference numerals are used to identify the same or similar parts.

For simplicity of illustration, in some of the drawings a single line has been used to identify a plurality of connections. Wherever this has occurred, a label indicating a plurality of connectors is associated with the illustrated line. For example, in FIG. 4, the outputs of the NOR gates I334–I355 are not tied together but are a plurality of separate lines as indicated by the nomenclature CY_i(i=1 to 22) appearing in the figure. Similarly, in FIG. 6, the single line connecting to axb<0:1> is representative of two separate connections axb<0> and axb<1>. Axb<0> is connected to the base of transistor N331, but not to transistor N332. Axb<1> is connected to the base of transistor N332, but not to transistor N331. A similar convention applies to inputs R<1:6>, ax9A<0:3>, R<7:22>, gy01<0:3>, gy23<0:3>, and gy345<0:7> in FIG. 6.

As shown in FIG. 1, the illustrated antifuse circuit includes a negative voltage generator 40 for generating a negative voltage to program an antifuse device, a special test mode decoder 10 (hereinafter called 'STM decoder') for outputting signals to select a specific antifuse box depending on address signals A1 to A4, a bank selector 20 for outputting a signal used to select a specific bank in a specific antifuse box depending on the output signals from the STM decoder 10 and address signals A12 and A13, a special address multiplexer (hereinafter called "SA multiplexer") 30 for outputting signals used to select a specific antifuse by decoding and combining the address signals A0 to A6 depending on the output signal from the bank selector 20, a unit antifuse circuit 50 for programming an antifuse device, a repair circuit (FUSE_Y_AF) 60 for repairing defective cells depending on the output signals from the unit antifuse circuit 50 and a power-up detector 70 for detecting the supply voltage to produce first through third control signals pwrup, pwrupb and pwr_d.

The operation of a circuit in which a third antifuse box is selected by the second and third addresses A2 and A3 in High states, will be explained by reference to the waveforms in FIGS. 7A and 7B and the circuit of FIG. 2B.

Figure 2A:
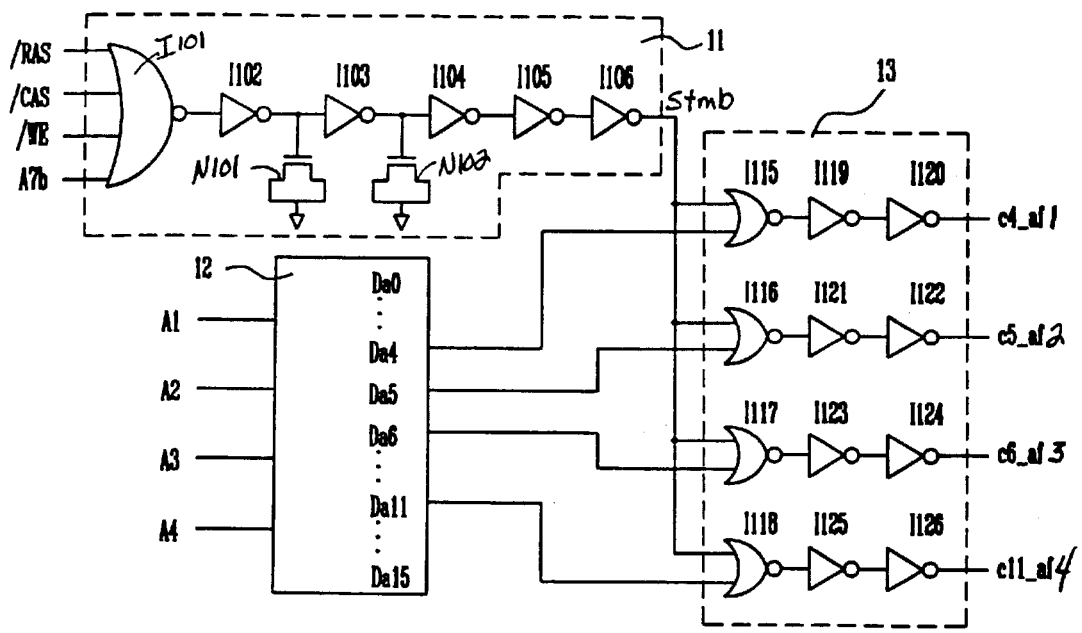
FIG. 2A is an internal circuit diagram of the special test mode decoder of FIG. 1.

FIG. 2A is a circuit diagram illustrating the STM decoder 10 shown in FIG. 1. The STM decoder 10 includes a control signal generator 11 for combining first through third external control signals /RAS, /CAS and /WE and the seventh address inverting signal A7b to generate an enable signal stmb. It also includes a decoder 12 for decoding first through fourth address signals A1 through A4 and a controller 13 for combining the output signals from the decoder 12 and the enable signal stmb to output signals c4_af1, c5_af2, c6_af3 and c11_af4 which together select a specific antifuse box.

The control signal generator 11 includes a first NOR gate I101 for receiving the first through third external control signals /RAS, /CAS and /WE and the seventh address inverting signal A7b. It also includes an inverting delay circuit for inverting and delaying the output signal from the NOR gate I101 to produce the enable signal stmb. The inverting delay circuit includes serially-connected inverters I101 through I106, a capacitor N101 connected between the connection point of the inverters I102, I103 and ground, and a capacitor N102 connected between the connection point of the inverters I103, I104 and ground. If the first through third external control signals /RAS, /CAS and /WE, and the seventh address inverting signal A7b are all Low, it enters a special test mode. The output of the NOR gate I101 becomes High by the signal and is then inverted via the inverting delay section, thus producing an enable signal stmb of Low.

The decoder 12 decodes the first through fourth address signals A1 through A4. The fourth, fifth, sixth and eleventh output signals Da4, Da5, Da6 and Da11 among the output signals from the decoder 12 are used to select an antifuse box.

Figure 2B:
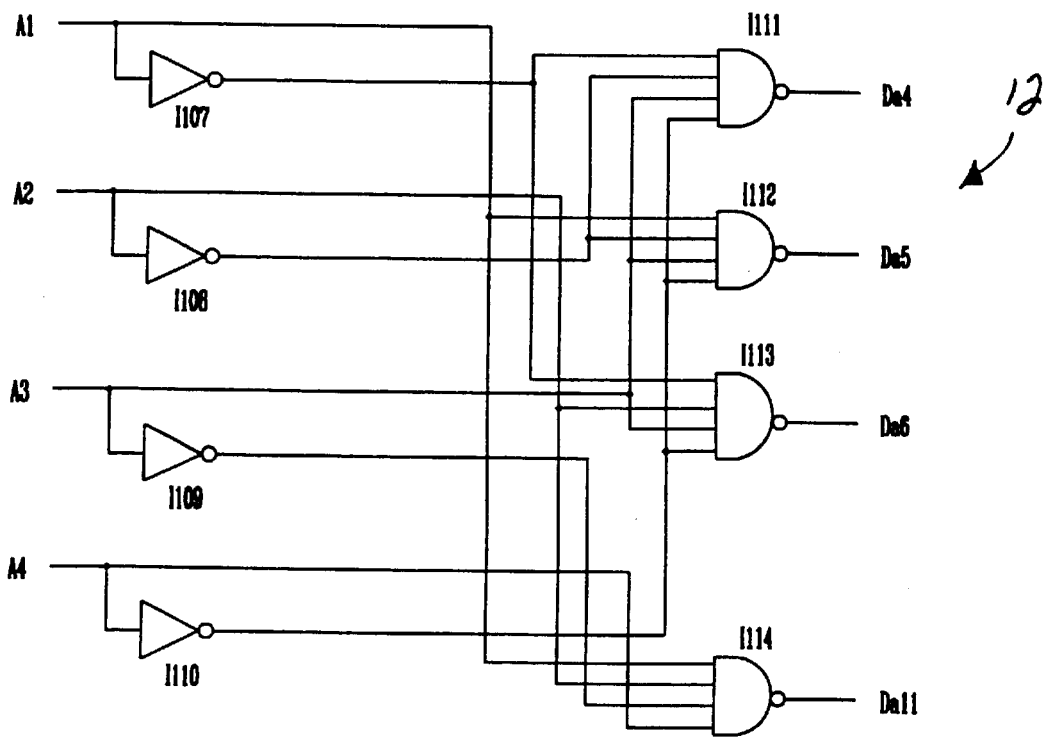
FIG. 2B is an internal circuit diagram of the decoder of FIG. 2A.

FIG. 2B illustrates the decoder 12 in further detail. As shown in FIG. 2B, the decoder includes four inverters I107, I108, I109 and I110 and four NAND gates I111, I112, I113 and I114. Input A1 is connected to an input of NAND gates I112 and I114 and to the input of inverter I107. Input A2 is connected to an input of NAND gates I113 and I114 and to the input of inverter I108. Input A3 is connected to an input of inverters I111, I112 and I113 and the input of inverter I109. Input A4 is connected to an input of inverter I114 and to the input of inverter I110. The output of inverter I107 is connected to an input of NAND gates I111 and I113. The output of inverter I108 is connected to an input of NAND gates I111 and I112. The output of inverter I109 is connected to an input NAND gate I114. The output of inverter I110 is connected to an input of NAND gates I111, I112 and I113. The outputs of NAND gates I111, I112, I113 and I114 are Da4, Da5, Da6 and Da11, respectively.

The controller 13 combines the fourth, fifth, sixth and eleventh output signals (Da4, Da5, Da6 and Da11) from the decoder 12 and the enable signal stmb into the second through fifth NOR gates I115 through I118. The output of the second NOR gate I115 is delayed by the inverters I119 and I120. The output of the third NOR gate I116 is delayed by the inverters I121 and I122. The output of the fourth NOR gate I117 is delayed by the inverters I123 and I124. The output of the fifth NOR gate I118 is delayed by the inverters I125 and I126. The output signals c4_af1, c5_af2, c6_af3 and c11_af4 for selecting specific antifuse boxes are produced at the outputs of the inverters I120, I122, I124 and I126, respectively.

As in this example (i.e., selecting the third antifuse box) the second and third address signals A2 and A3 are High and inputs A1 and A4 are Low, the input signals to the third NAND gate I113 become High, thus producing a Low signal at Da6. The output signal of the third NAND gate I113 and the enable signal stmb are both Low and are combined into the fourth NOR gate I117 such that the output signal c6_af3 for selecting the third antifuse box is outputted High. The output of the NOR gate I117 is delayed by the inverters I123 and I124. The output signals c4_af1, c5_af2 and c11_af4 for selecting the remaining first, second and fourth antifuse boxes are outputted Low.

Figure 3:
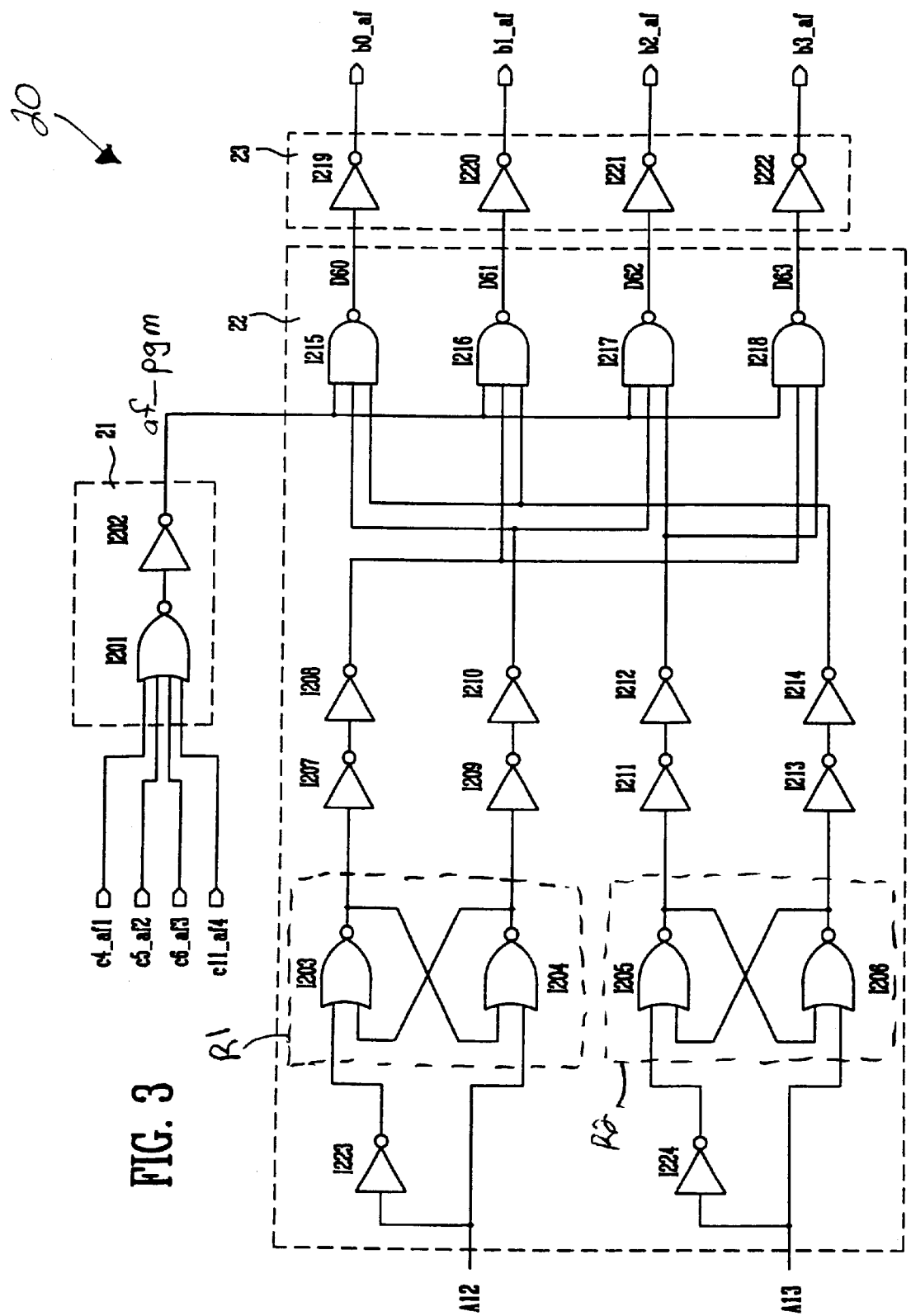
FIG. 3 is an internal circuit diagram of the bank selector of FIG. 1.

FIG. 3 is a circuit diagram illustrating the bank selector 20. The bank selector 20 combines the output signals c4_af1, c5_af2, c6_af3 and c11_af4 of the STM decoder 10 to produce a second enable signal af_pgm and also decodes the twelfth and thirteenth address signals A12 and A13 to output signals b0_af, b1_af, b2_af and b3_af for selecting specific antifuse banks.

The operation of the circuit in which the twelfth and thirteenth address signals A12 and A13 are inputted with Low to select the first antifuse bank will be explained below as an example by reference to the circuit construction of the bank selector 20 and the waveforms in FIGS. 7A and 7B.

The bank selector 20 includes a control signal generator 21 for combining the output signals of the STM decoder 10 to produce the enable signal af_pgm. It also includes a decoder 22 for decoding the twelfth and thirteenth address signals A12 and A13 when the enable signal af_pgm is High. The bank selector 20 further includes an inverting section 23 for inverting the output signal of the decoder 22 to produce signals for selecting specific antifuse banks.

The control signal generator 21 includes a first NOR gate 1201 for receiving the output signals c4_af1, c5_af2, c6_af3 and c11_af4 of the STM decoder 10, and a first inverter 1202 for inverting the output signal of the first NOR gate 1201 to produce the enable signal af_pgm.

The decoder 22 decodes the twelfth and thirteenth address signals A12 and Al 3 when activated by the enable signal af_pgm. The decoder 22, unlike the conventional decoder, further includes NOR latches R1 and R2 for latching address non-inverting signals and inverting signals and buffers I207 through I214 for delaying the output signals of the NOR latches R1 and R2.

Also the NAND gates I215 through I218 on the output end combines the enable signal af_pgm with the address non-inverting signal and the inverting signals to output decoded signals when the enable signal af_pgm is High.

The inverting section 23 inverts each of the output signals of the decoder 22 to produce signals b0_af, b1_af, b2_af and b3_af for selecting specific antifuse banks.

If the twelfth and the thirteenth address signals A12 and A13 are inputted with Low, the decoder 22 outputs the first output signal D60 as a Low signal, depending on the enable signal. The enable signal af_pgm becomes High at the control signal generator 21 by means of the output signal of the STM decoder 10. The first output signal D60 is inverted by the first inverter I219 in the inverting section 23 to produce the output signal b0_af for selecting the first antifuse bank. The signals b1_af, b2_af and b3_af for selecting the remaining second through fourth antifuse banks are outputted as a Low state.

Figure 4:
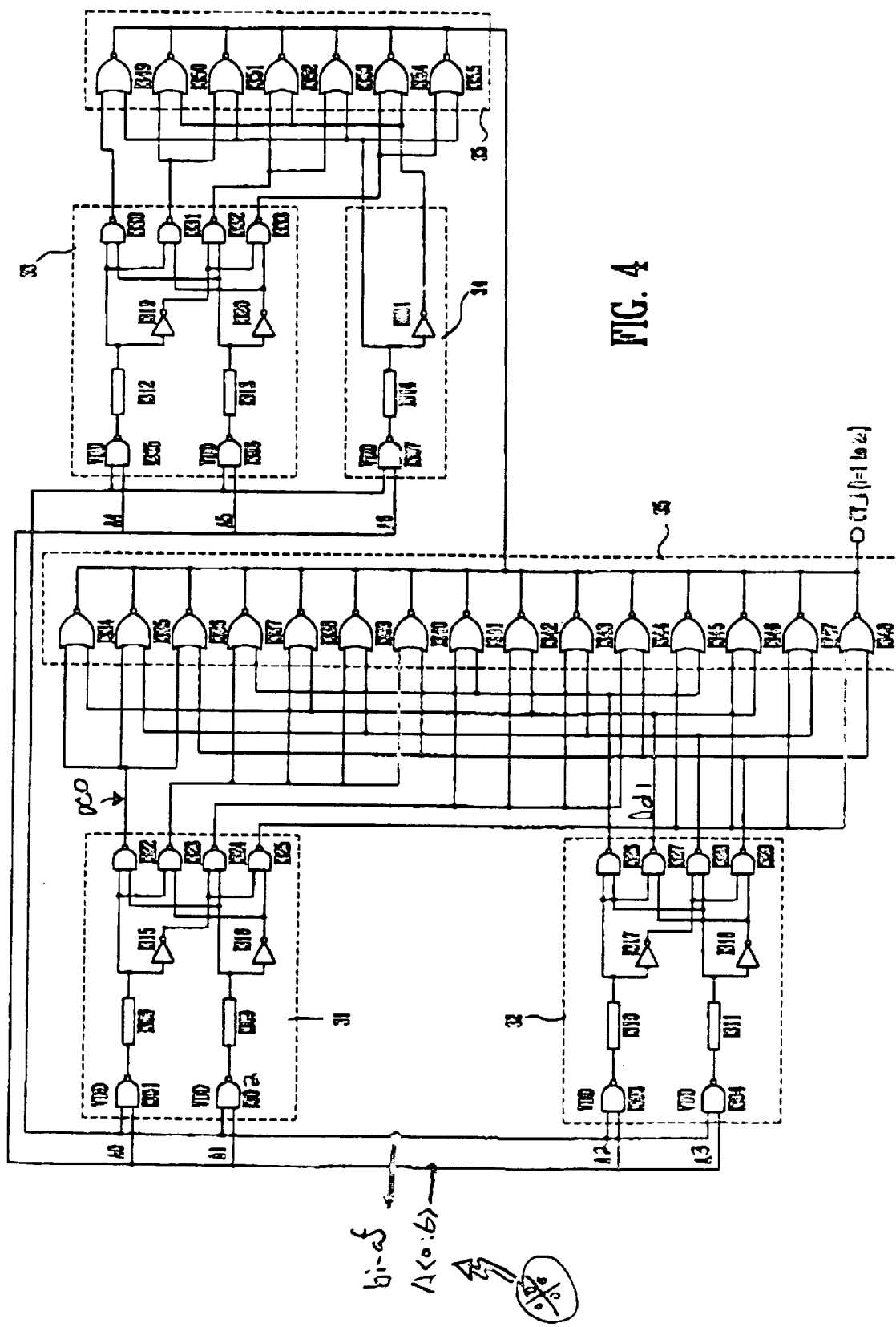
FIG. 4 is an internal circuit diagram of the special address multiplexer of FIG. 1.

FIG. 4 is an internal circuit diagram illustrating the special address (SA) multiplexer 30. The SA multiplexer 30 selects a specific one of twenty-two antifuses within the antifuse box using the selected output signals b0_af through b3_af from the bank selector 20 and the first through the seventh address signals AO through A6.

The operation of a circuit in which the first antifuse is selected by the address signal A3 (ya<3>) by reference to the circuit construction of the SA multiplexer 30 and the waveforms in FIGS. 7A and 7B will be explained below.

The SA multiplexer 30 includes a first decoder 31 for decoding the first and second addresses A0 and A1, a second decoder 32 for decoding the third and fourth addresses A2 and A3, a third decoder 33 for decoding the fifth and sixth addresses A4 and A5, a fourth decoder 34 for decoding the seventh address A6, and an output section 35 for combining the output signals of the first through fourth decoders to output a signal for selecting a specific antifuse.

The first through fourth decoders 31 through 34 includes level shifters I308 through I314. The level shifters I308 through I314 convert the output voltages of the NAND gates I301 through I307 on the input end into a first voltage Vext necessary to program an antifuse device.

The first through fifteenth NOR gates I334 through I348 in the output section 35 decode the output signal of the first decoder 31 into an upper-bit and the output signal of the second decoder 32 into a lower-bit, thus generating a signal for selecting the first through fifteenth antifuse devices. The sixteenth through twenty-second NOR gates I349 through I355 decode the output signal of the third decoder 33 into an upper-bit and the output signal of the fourth decoder 34 into a lower-bit, thus generating a signal for selecting the sixteenth through twenty-second antifuse devices.

If the fourth address signal A3 of the first through the seventh address signals A0 through A6 is inputted as a High state, the first decoder 31 outputs the first output Dc0 as a Low state and the second decoder 32 outputs the second output Dd1 as a Low state. The first NOR gate I334 to which the output signals are inputted outputs a High signal selecting the first antifuse device. The remaining second through twenty-second NOR gates I345 through I355 output Low states.

Figure 5:
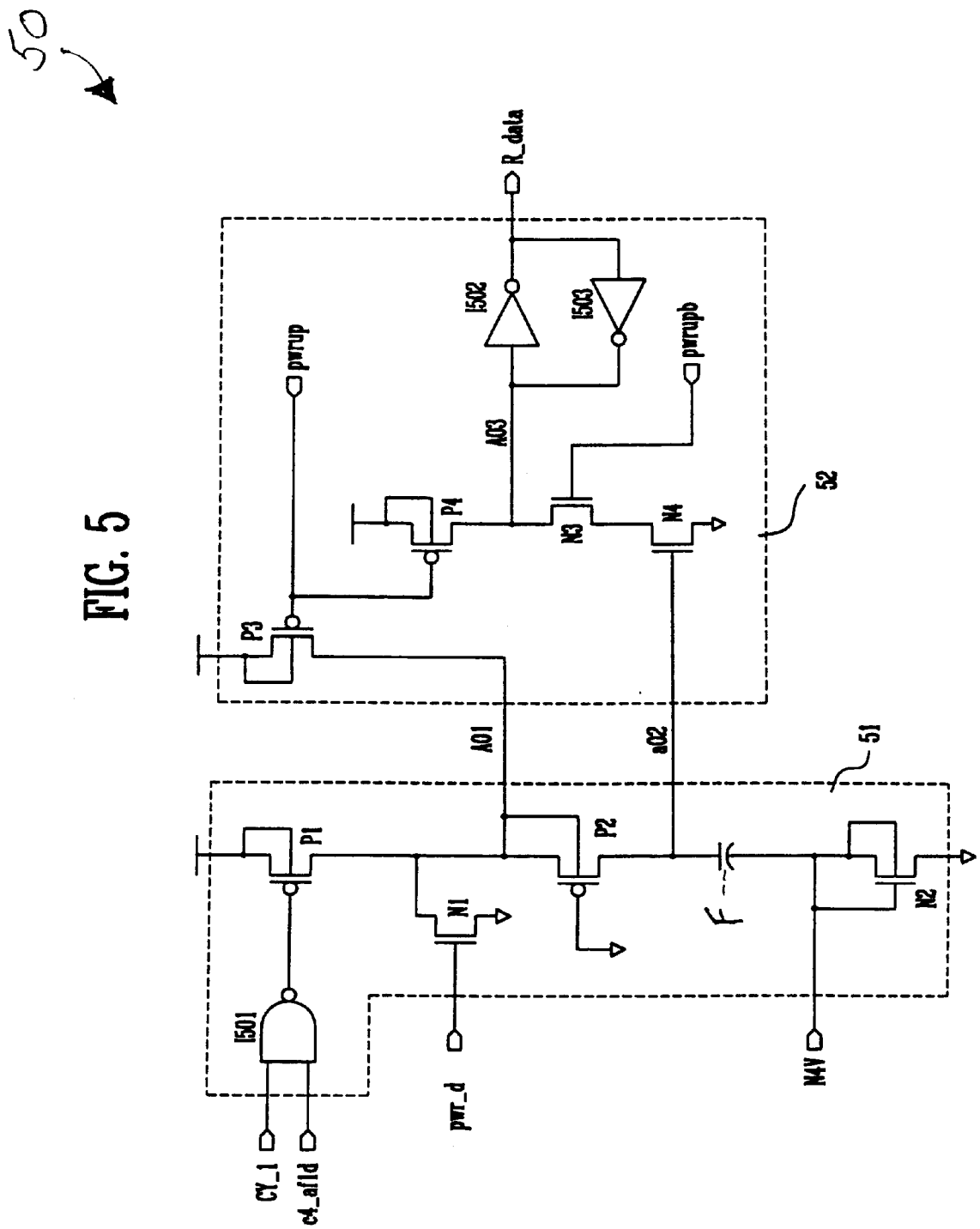
FIG. 5 is a circuit diagram of the unit antifuse of FIG. 1.

FIG. 5 is a circuit diagram illustrating the unit antifuse circuit 50, twenty-two of which constitute a single antifuse box. The construction of the circuit and operation thereof will now be explained below.

The unit antifuse circuit 50 includes a program section 51 for programming the antifuse device and a detection/latch section 52 for detecting/latching whether the antifuse device is programmed or not.

An example in which the antifuse device F is programmed will be explained first. The antifuse device F is selected depending on the output signals of the STM decoder 10 and the SA multiplexer 30. The first NAND gate I501 in the program section 51 combines the output signals from the STM decoder 10 and the SA multiplexer 30 to turn on the first PMOS transistor P1. The supply voltage is applied to the first terminal of the antifuse device F by means of the first and second PMOS transistors P1 and P2. Upon programming, a negative voltage is applied to the N4V terminal. The negative voltage is applied to the second terminal of the antifuse device F. Therefore, the antifuse device F is programmed by the difference of a high voltage between both the terminals.

Second, the detection and latch operation will be explained below. The detection and latch operation is performed for a power stabilization period (Off/On operation of the power). As the supply voltage is increased to a given voltage, the power-up detector 70 in FIG. 1 outputs the first input signal pwrnp as a Low state, the second input signal pwrupb as a High state and the third input signal pwr_d as a Low state. Then, it applies these input signals to the detection/latch section 52. The second through fourth PMOS transistors P2 through P4 are turned on by the first input signal pwrup, so that the supply voltage is applied to the first through third nodes A01 through A03. If the antifuse device F is not programmed, the potential of the second node A02 is kept intact, so that it is applied to the gate of the fourth NMOS transistor N4. The potentials of the third NMOS transistor N3 and the fourth NMOS transistor N4, which are turned on by the second input signal pwrupb, make the potential of the third node A3 a Low state, which in turn latches the output signal of a High state. If the antifuse device F is programmed, the potential of the second node A02 falls into a ground voltage via the antifuse device F and the second NMOS transistor N2, which in turn makes the fourth NMOS transistor N4 turn off. As a result, the potential of the third node A03 is kept at the supply voltage by means of the fourth PMOS transistor P4 being turned on. This latches the output signal in a Low state.

The fourth NMOS transistor N4 between the N4V terminal and the ground voltage is connected in order to block a PN forward pass {p-well (0 V) TO drain (−4 V)} between the P-Well and the drain upon generation of a negative voltage. Also, it forms an n-well guardring (Vcc) to block the pass of the P-well and the P-type substrate.

Figure 6:
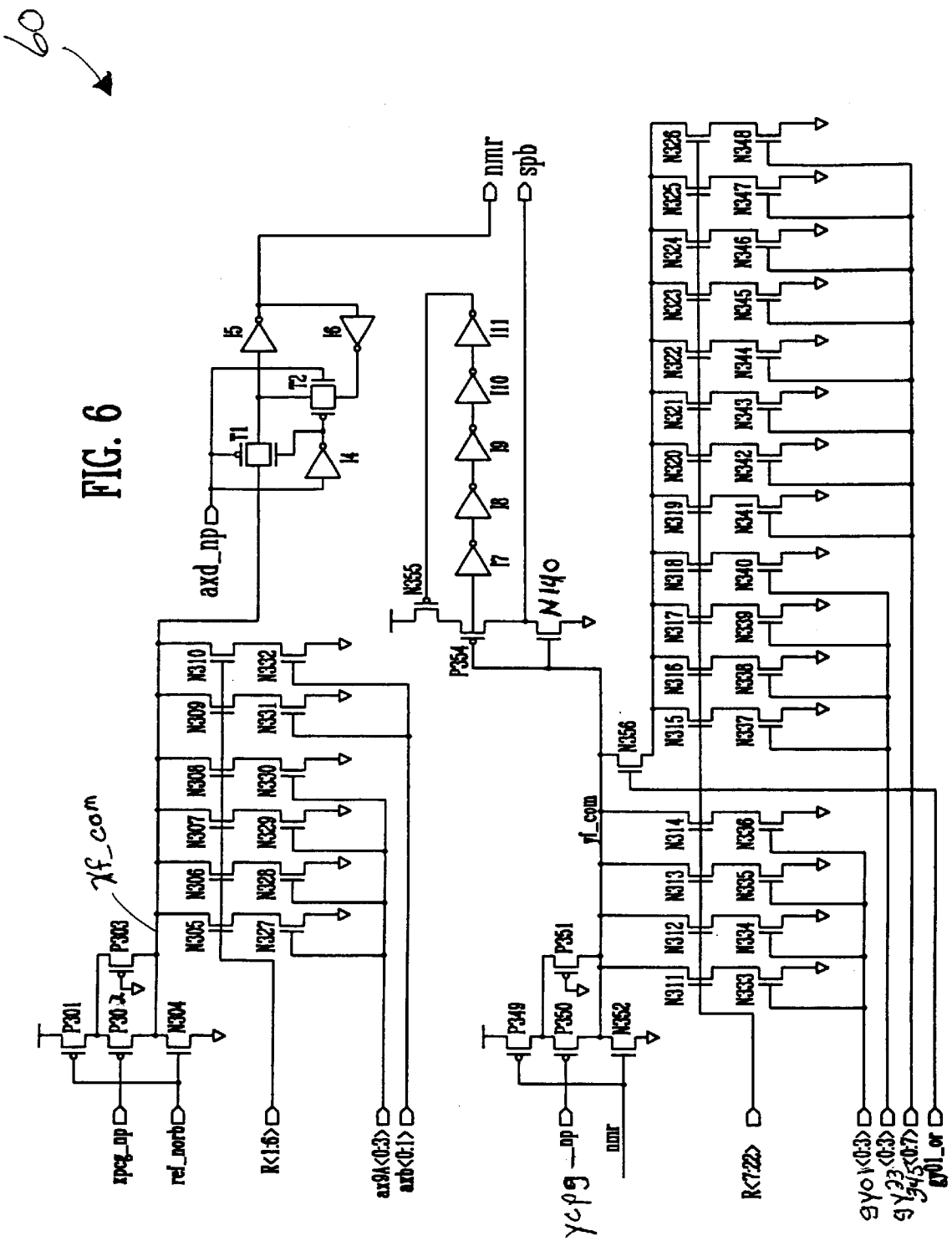
FIG. 6 shows a repair fuse circuit using an antifuse.

FIG. 6 shows a repair circuit 60 using the output of the unit antifuse circuits 50 and an external control signal. The repair circuit 60 responds to the output signal R<1> through R<22> of the unit antifuse circuit 50 shown in FIG. 5 instead of a cut/non-cut of a laser fuse. If the antifuse is programmed, the output signal R<1> through R<22> of the unit antifuse circuit 50 becomes a Low state. On the other hand, if the antifuse is not programmed, it becomes a High state. In an actual repair, five corresponding antifuses of the twenty-two antifuses are broken. Therefore, the output signals of the five antifuse circuits 50 are latched to "Low" and those of the remaining seventeen antifuse circuits 50 are latched to "High".

The case of a precharge PCG state will be first explained by reference to FIG. 6. As the first control signal xpcg_np is High, the second control signal ref_norb is Low (since it is not at a refresh mode) and the third control signal axd_np is High, the NMOS transistor N304 is turned off and the node xf_com is precharged into High by the PMOS transistors P301 and P303. Also the normal signal nmr is set to High. As the sixth control signal ycpg_np and the normal signal nmr are High, and the seventh control signals gy01<0> through gy01<3>, the eighth control signals gy23<0> through gy23<3> and the ninth control signals gy345<0> through gy345<7> are Low, the node yf_com is precharged into Low. The tenth control signal gy01_or is enabled into a High pulse if an internal or external Y address is inputted. The NMOS transistor N140 is turned off by the Low signal of the node yf_com and the output signal spb is disabled into a High state by means of the PMOS transistor P354.

Second, a normal read/write (active) operation will be explained below. One of the fourth control signals ax9A<0> through ax9A<3> becomes High and one of the fifth control signals axb<0> and axb<1> becomes High to select 1M unit block of 8M blocks. As the antifuse signals R<1> through R<6> are High, the NMOS transistors N305 through N310 are turned on and one of the NMOS transistors N327 through N330 and one of the NMOS transistors N331 and N332 are turned on to discharge the node xf_com into a Low state. Also the third control signal axd_np becomes a Low pulse so that the transfer gate T1 is turned on. As a result, the normal signal is kept at High state. The normal signal nmr, one of the seventh control signals gy01<0> through gy01<3>, one of the eighth control signals gy23<0> through gy23<3>, one of the ninth controls signals gy345<0> through gy345<7> and the tenth control signal gy01_or become a High state, and the antifuse output signals R<7> through R<22> discharge the node yf_com into a Low state by High signal. The voltage of the node yf_com turns on the NMOS transistor N140, which in turn turns on the PMOS transistor P354, so that the output signal spb is disabled into a High state.

Third, the operation upon a repair mode will now be explained. Upon conventional repair, fuses corresponding to fail addresses are cut by a laser. However, in the present example, it is assumed that failed addresses, for example, ax9A_0, axb_0, gy01_0, gy23_0 and gy345_0 are cut by the unit antifuse 50. One fuse from each group (e.g., gy01<0:3>, gy23<0:3>, and gy345<0:7>) is cut. The first control signal xpcg_np is a High signal and the second control signal is a Low signal. Though the first address of the fourth control signals ax9A<0> through ax9A<3> and the first address of the fifth control signals axb<0> and axb<1> are enabled into a High signal, the node xf_com continues to be charged with a High state since corresponding addresses have been cut by the unit antifuse 50. When the third control signal axd_np becomes a Low pulse the transfer gate T1 is turned on. As a result, the normal signal nmr is enabled from a High state to a Low state. The sixth control signal ycpg_np becomes a High state and the normal signal nmr becomes a Low state. Each one of gy01<0> through gy01<3>, gy23<0> through gy23<3> and gy345<0> through gy345<7>, which are address signals, is enabled into a High signal, but the corresponding addresses are cut. Therefore, the node yf_com is kept at High state without being discharged. The NMOS transistor N140 is turned on by the voltage of the node yf_com, the output signal spb of which becomes a Low state, thus enabling the redundant column. In other words, the redundant column address is enabled by the output signal spb.

Figure 7A:
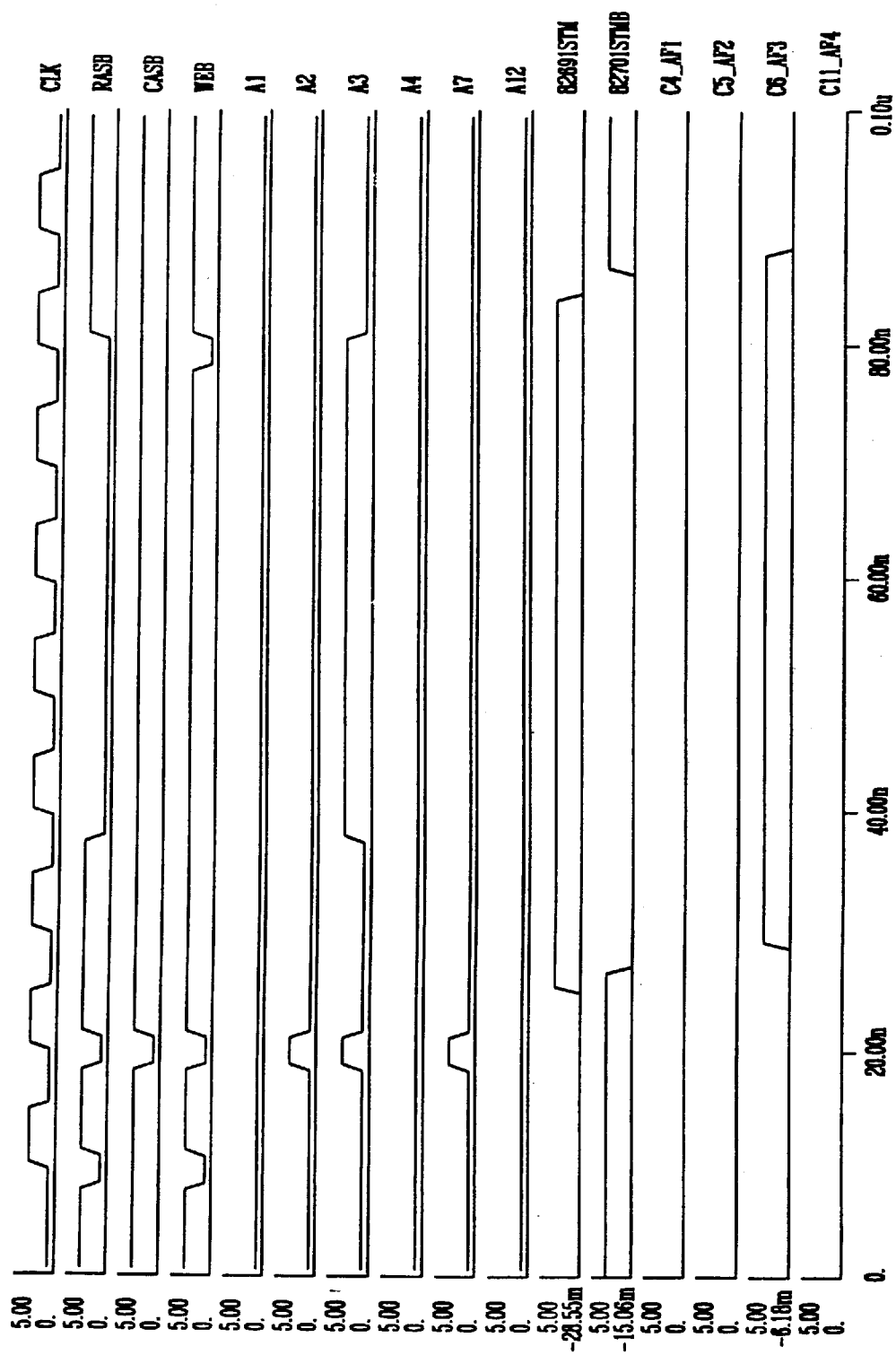
FIGS. 7A and 7B show waveforms resulting from a simulation on an exemplary antifuse program circuit.
Figure 7B:
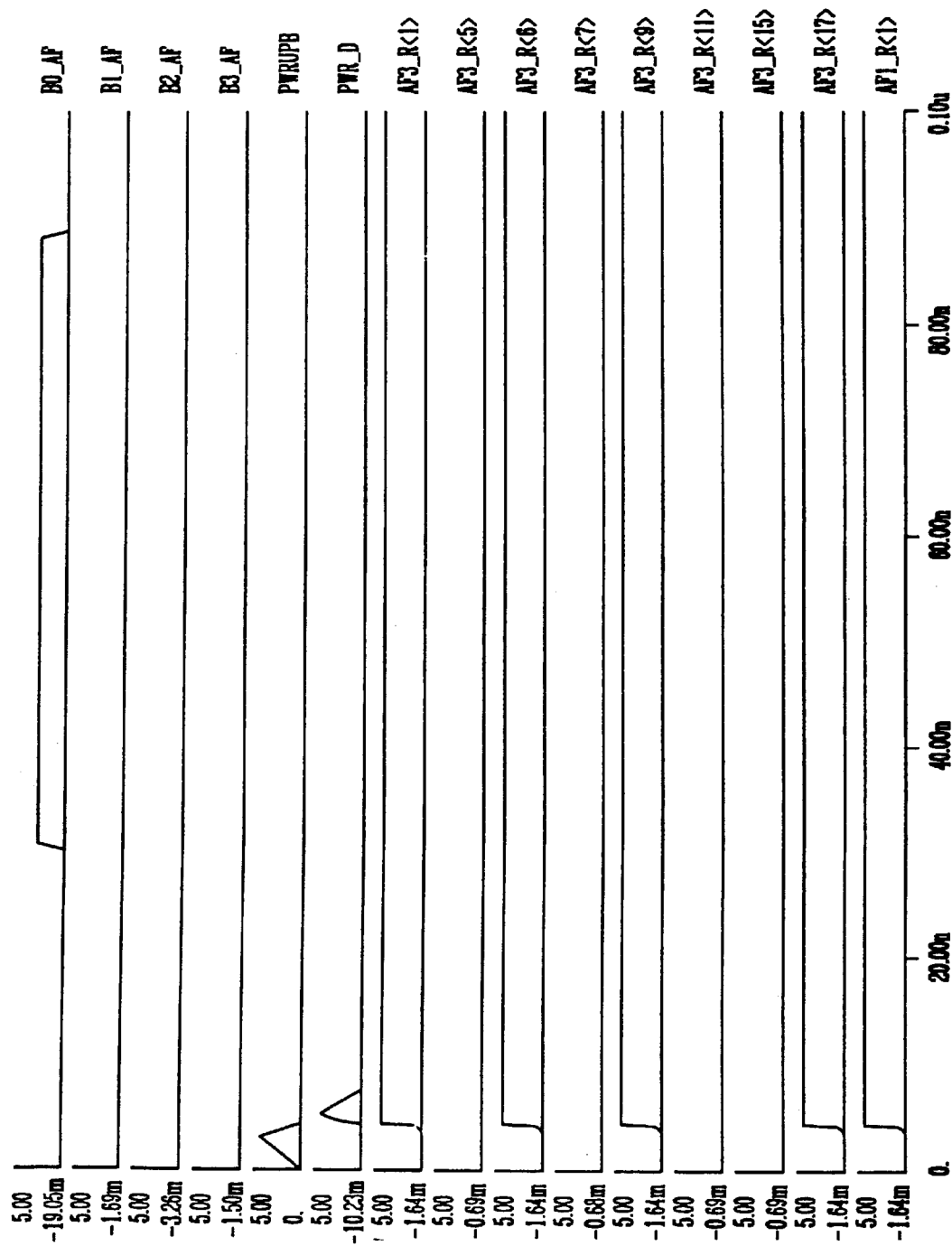

FIGS. 7A and 7B show waveforms resulting from a simulation on an antifuse program circuit. When the antifuse is programmed, a special test mode must be first entered. As shown in FIGS. 7A and 7B, when the control signals /RAS, /CAS and /WE are at Low state and the address A7 is at High state, it enters an STM mode {8269|STM is High and 8270|STMB is Low}. If the addresses A2 and A3 become a High state, the output signal C6_AF3 of the STM decoder 10 for selecting an antifuse box is enabled into a High state.

In the drawing, an example is shown wherein the first bank is selected since the addresses A12 and A13 become a Low state and the output signal B0_AF of the bank selector 20 becomes a High state.

The second and third control signals pwrupb and pwr_d are output signals generated by the power-up detector 70 that sense the supply voltage during the power stabilization period. During the power stabilization period, the control signals pwrupb and pwr_d are used to detect whether the program for the antifuse has completed or not and to latch the result. As a result, the output voltages AF3_R<5>, AF3_R<7>, AF3_R<11> and AF3_R<15> of the programmed antifuse device are shown to be in a Low state.

After entering the STM mode, the device is set to the row active operating mode, thus driving the C6_AF3, BO_AF and address A3 to a High state, so that the first antifuse of the third antifuse box in the first bank is programmed. There is shown the state in which the AF3_R<1> is programmed with the AF3_R<5>, AF3_R<7>, AF3_R<11> and AF3_R<15> being already programmed to latch a Low. The outputs of the non-programmed antifuses are latched into a High state.

Figure 8:
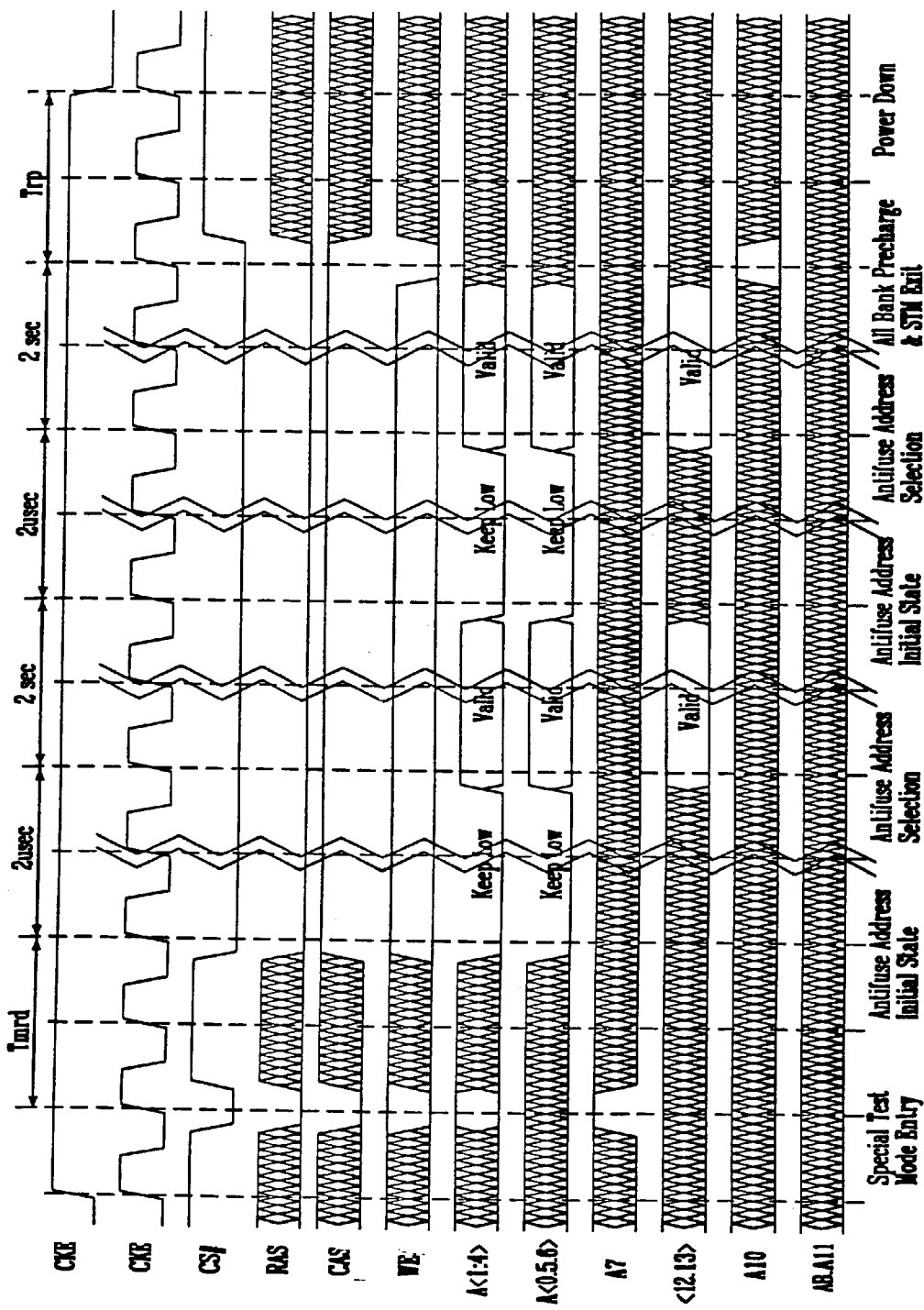
FIG. 8 is a flowchart of an exemplary antifuse program test.

FIG. 8 shows the result of an antifuse repair programming. Entrance of a special test mode (STM) will be explained first. When a mode register set (MRS), that is, RAS, CAS and WE are at Low state and the address A7 is at High state, it enters the STM. At this time, the MRS is to determine a Cas Latency (CL) and a Burst Length (BL) in a SDRAM. The CL and BL are determined by use of an address signal when the Rasb, Casb and Web are at Low state. With entrance of the STM, signals c4_af1, c5_af2, c6_af3 and c11_af4 are generated to select one of the sixteen antifuses along with a bank select signal.

Second, an initialization for programming the antifuse will be explained. In a Low active state, all the addresses A0 through A6 are initialized into a Low state (about 2 sec). This is for stabilizing the voltage generator for generating a program voltage before the antifuse is programmed.

Third, an antifuse programming selected by an antifuse address will be explained. In a Low active state, antifuses selected by the addresses A0 through A6 are programmed. The programming is performed by applying a Vext voltage across the antifuse device F and by applying a negative voltage to the N4V (about 2 sec) in the unit antifuse circuit. The programming time can be found by performing tests.

Fourth, after one antifuse is programmed, it is kept for about 2 seconds in order to stabilize the voltage generator. This process is the same for the second process.

Fifth, the second and third processes are repeated four times, thus sequentially completing programming for the five antifuses of the twenty-two antifuses in the one selected antifuse box.

Sixth, it precharges all the banks and exits the special test mode. The first through fifth processes are repeated for repairing other antifuse boxes.

Seventh, after the antifuses are completely programmed, a repair address is latched along with a power up by the power on/off to replace defective cells.

Conventionally, poly fuses in a wafer state are blown by a laser for repair. Then, antifuse is used to minimize defective products generated after the memory is packaged. In order to implement this antifuse, a specific address is required for every antifuse. As one box includes twenty-two antifuses, if the fuse boxes are multiplied, the number of the total antifuses is very large. This requires additional address pins in order to decode all the antifuses. Therefore, the disclosed device implements a special address multiplexer by which all the antifuses can be decoded without additional address pins. As a result, the disclosed device has the outstanding advantage that all the antifuses can be decoded and tested without addition address pins.

From the foregoing, persons of ordinary skill in the art will appreciate that an antifuse repair circuit has been disclosed which is capable of specifying an address of an antifuse by decoding it without an additional address pin when a specific antifuse is programmed for repair.

The teachings of the present invention have been illustrated with reference to a particular embodiment in connection with a particular application. Those having ordinary skill in the art and access to the teachings of the present invention will recognize additional modifications and applications within the scope the invention. This patent is therefore intended to cover any and all such applications, modifications, and embodiments falling within the scope of the appended claims.

What is claimed is:

1. An antifuse repair circuit comprising:
    a special test mode decoder for generating an STM output signal identifying an antifuse box according to an address signal;
    a bank selector for generating a bank output signal identifying an antifuse bank in response to the STM output signal from the special test mode decoder and the address signal;
    a special address multiplexer for generating an SA output signal identifying a specific antifuse within the antifuse bank identified by the bank selector in response to the bank output signal from the bank selector and the address signal;
    a negative voltage generator for generating a negative voltage to program an antifuse device;
    a power-up detector for detecting the supply voltage to generate a plurality of control signals to determine whether the antifuse device has been programmed;
    a unit antifuse circuit for programming the antifuse device according to the STM output signal from the special test mode detector, the SA output signal from the special address multiplexer, the negative voltage from the negative voltage generator, and the plurality of control signals from the power-up detector, the unit antifuse circuit developing a unit antifuse output signal; and
    a repair circuit responsive to the unit antifuse output signal from the unit antifuse circuit and an external control signal to replace a defective cell with a redundant cell.

2. The antifuse repair circuit according to claim 1, wherein the special test mode decoder comprises:
    a control signal generator for combining the external control signal and at least a portion of the address signal to generate an enable signal,
    a decoder for developing a decoded signal from a plurality of input addresses associated with the address signal, and
    a controller for combining the decoded signal of the decoder and the enable signal to develop the STM output signal.

3. The antifuse repair circuit according to claim 2, wherein the control signal generator comprises:
   a first NOR gate for combining the external control signal and the at least a portion of the address signal into a NOR output signal, and
   a delay circuit for inverting and delaying the NOR output signal of the first NOR gate.

4. The antifuse repair circuit according to claim 2, wherein the controller comprises:
   a plurality of NOR gates for combining the enable signal and a respective portion of the decoded signal of the decoder, to each respectively generate a component of the STM output signal, and
   a plurality of inverters, each of the plurality of inverters delaying a respective one of the components of the STM output signal received from the NOR gates.

5. The antifuse repair circuit according to claim 1, wherein the bank selector comprises:
   a decoder for decoding at least two components of the address signal into a bank decoded signal,
   a control signal generator for combining components of the STM output signal of the special test mode decoder to generate an enable signal, and
   means for inverting the bank decoded signal of the decoder when the enable signal has a predetermined state to generate the bank output signal.

6. The antifuse repair circuit according to claim 5, wherein the decoder comprises:
   first and second latches for respectively latching the at least two components of the address signals and inverted signals corresponding to the at least two components of the address signal,
   means for delaying latch output signals of the first and second latches to generate delayed latch output signals,
   a plurality of NAND gates for combining the delayed latch output signals of the delaying means into NAND output signals when the enable signal has the predetermined state, and
   an inverter for inverting the NAND output signals of the plurality of NAND gates to generate the bank output signal.

7. The antifuse repair circuit according to claim 5, wherein the control signal generator comprises:
   a first NOR gate for combining components of the STM output signal of the special test mode decoder into a NOR output signal, and
   an inverter for inverting the NOR output signal of the first NOR gate to generate the enable signal.

8. The antifuse repair circuit according to claim 1, wherein the special address multiplexer comprises:
   a first decoder for decoding first and second components of the address signal in accordance with the bank output signal of the bank selector,
   a second decoder for decoding third and fourth components of the address signal in accordance with the bank output signal of the bank selector,
   a third decoder for decoding fifth and sixth components of the address signal in accordance with the bank output signal of the bank selector,
   a fourth decoder for decoding a seventh component of the address signal in accordance with the bank output signal of the bank selector, and
   output means for combining outputs of the first, second, third and fourth decoders to generate the SA output signal.

9. The antifuse repair circuit according to claim 8, wherein each of the first, second, third and fourth decoders comprises:
   a first NAND gate developing a first output signal;
   a first level shifter for shifting the first output signal to a higher potential;
   a second NAND gate developing a second output signal; and
   a second level shifter for shifting the second output signal to a higher potential.

10. The antifuse repair circuit according to claim 8, wherein the output means comprises:
    a first plurality of NOR gates for combining an output signal of the first decoder into an upper-bit signal and an output signal of the second decoder into a lower-bit signal; and
    a second plurality of NOR gates for combining an output signal of the third decoder into a lower-bit signal and an output signal of the fourth decoder into an upper-bit signal.

11. The antifuse repair circuit according to claim 1, wherein the unit antifuse circuit comprises the STM output signal of the special test mode decoder and the SA output signal of the special address multiplexer in order to program the antifuse device.

* * * * *